(12) United States Patent
Lee

(10) Patent No.: US 9,070,592 B2
(45) Date of Patent: Jun. 30, 2015

(54) METHOD FOR FABRICATING A CONNECTION REGION IN A SEMICONDUCTOR DEVICE

(71) Applicant: SK hynix Inc., Icheon-si (KR)

(72) Inventor: Sang Soo Lee, Gyeonggi-do (KR)

(73) Assignee: SK Hynix Inc., Icheon (KR)

( * ) Notice: Subject to any disclaimer, the term of this patent is extended or adjusted under 35 U.S.C. 154(b) by 159 days.

(21) Appl. No.: 13/888,307

(22) Filed: May 6, 2013

(65) Prior Publication Data

US 2014/0151805 A1     Jun. 5, 2014

Related U.S. Application Data

(62) Division of application No. 12/495,578, filed on Jun. 30, 2009, now Pat. No. 8,455,326.

(30) Foreign Application Priority Data

Feb. 27, 2009  (KR) .................. 10-2009-0016910

(51) Int. Cl.
*H01L 27/12*  (2006.01)
*H01L 21/74*  (2006.01)

(52) U.S. Cl.
CPC .......... *H01L 27/1203* (2013.01); *H01L 21/743* (2013.01)

(58) Field of Classification Search
CPC .................. H01L 27/1203; H01L 21/743
USPC ........ 438/270, 282, 361; 257/330, 332, 347, 257/E29.26, E27.112
See application file for complete search history.

(56) References Cited

U.S. PATENT DOCUMENTS

| 7,338,862 B2 | 3/2008 | Huo et al. |
| 7,611,931 B2 * | 11/2009 | Cheng et al. .................. 438/152 |
| 2003/0129829 A1 | 7/2003 | Greenlaw |

FOREIGN PATENT DOCUMENTS

| KR | 10-2006-0102672 A | 9/2006 |
| KR | 10-2007-0077386 A | 7/2007 |

* cited by examiner

*Primary Examiner* — David Vu

(57) ABSTRACT

Disclosed herein is a fabrication method of a semiconductor device to order to increase an operation liability of the semiconductor device. A method for fabricating a semiconductor device comprises forming a buried-type wordline in an active region defined on a SOI substrate, forming a silicon connection region for connecting an upper silicon layer to a lower silicon layer between neighboring buried type wordlines, and recovering the upper silicon layer on the silicon connection region.

9 Claims, 4 Drawing Sheets

METHOD FOR FABRICATING A CONNECTION REGION IN A SEMICONDUCTOR DEVICE

CROSS-REFERENCE TO RELATED APPLICATIONS

The present application is a divisional application of U.S. patent application Ser. No. 12/495,578, filed on Jun. 30, 2009, which claims priority to Korean Patent Application No. 10-2009-0016910, respectively filed on Feb. 27, 2009, which are incorporated by reference in their entirety.

BACKGROUND OF THE INVENTION

The present invention relates to a method of fabricating a high-integrated semiconductor device, and more specifically, to a method of forming a field effect transistor on a partially insulated semiconductor substrate.

In a system comprising a plurality of semiconductor devices, a semiconductor memory apparatus is configured to store data generated or processed therein. For example, if a request from a data processor such as a central processing unit (CPU) is received, the semiconductor memory apparatus outputs data to the data processor from unit cells therein or stores data processed by the data processor to the unit cells, according to an address transmitted with the request.

Although data storage capacity of semiconductor memory apparatus has increased, sizes of semiconductor memory apparatus have not increased proportionally. Thus, various elements and components used for read or write operations in the semiconductor memory apparatus have also reduced in size. Accordingly, components and elements unnecessarily duplicated in the semiconductor memory apparatus, such as transistors or wires, are combined or merged to reduce the area occupied by each component. Particularly, the reduction of the size of unit cells included in the semiconductor memory apparatus affects improvement of integration.

Due to the high degree of integration of semiconductor devices, the size of, for example, a field effect transistor (FET) that includes bulk silicon as the body is smaller; problems such as a short channel effect and increase of leakage current as well known to a person having an ordinary skill in the art are occurred.

In order to prevent the short channel effect and increase of leakage current, a method for fabricating a semiconductor device to form a transistor over a substrate having a silicon on insulator (SOI) structure has been suggested. The SOI substrate includes an insulating film formed over a lower semiconductor substrate and a silicon film formed over the insulating film. When a floating body transistor is formed in the SOI substrate, a body of the transistor is formed in the silicon film formed over the insulating film. The body of the neighboring transistor is isolated by a device isolation film that is contacted to the insulating film in order to reduce the leakage current. Source and drain regions are formed using both sides of the three-dimensional transistor body, thereby increasing the channel length than a conventional two-dimensional plane structure.

However, when the transistor is formed over the SOI substrate, a floating body effect is generated. The SOI substrate includes an insulating film positioned between the semiconductor substrate and the silicon film. The SOI substrate has a capacitor structure. When charges move repeatedly through the body of the transistor, the charges are accumulated in the capacitor through generation and recombination of a bias and a carrier, thereby degrading the operation of the semiconductor device. The threshold voltage of the transistor fluctuates due to the charges accumulated in the capacitor. The capacitor repeatedly accumulates and emits the charges, thereby generating thermal energy. The generation of leakage current resulting from a field effect concentration is called a Kink effect. Thus, in order to prevent degradation of the operational characteristic of the semiconductor device due to the structural characteristic of the SOI substrate, new structure for the semiconductor device is required.

SUMMARY OF THE INVENTION

Various embodiments of the invention are directed at providing a semiconductor device and a method for fabricating the same. In the semiconductor device, a silicon connection region for connecting an upper silicon layer of a SOI substrate to a lower silicon layer is formed below a bit line contact formed between two neighboring gate electrodes in an active region over the SOI substrate. As a result, a transistor formed on the SOI substrate can reduce leakage current. Also, since the SOI substrate is recessed for forming the silicon connection region after two neighboring gate electrodes are formed, difficulty or adversity on fabrication process can be more or less removed to thereby increase yield of the semiconductor device.

According to an embodiment of the present invention, a method for fabricating a semiconductor device comprises forming a buried-type wordline in an active region defined on a SOI substrate, forming a silicon connection region for connecting an upper silicon layer to a lower silicon layer between neighboring buried type wordlines, and recovering the upper silicon layer on the silicon connection region.

Preferably, the-forming-buried-type-wordline includes forming a device isolation layer defining the active region on the SOI substrate, forming recesses in the active region, depositing a conductive material in a lower part of the recesses, and filling up an insulating material in a remained part of the recesses.

Preferably, the upper silicon layer on a buried insulating layer of the SOI substrate have a thickness of about 1400 to about 1600 Å, and the depth of the recesses is in the range of about 1000 to about 1300 Å.

Preferably, the device isolation layer is connected to the buried insulating layer.

Preferably, the forming-a-device-isolation-layer includes removing the upper silicon layer exposed by a mask defining the active region to expose the buried insulating layer.

Preferably, the thickness of the device isolation layer is same to that of the upper silicon layer.

Preferably, the-forming-buried-type-wordline further includes injecting dopant-ion into a bottom of the recesses to thereby form a channel region under the buried type wordline, before the conductive material is deposited.

Preferably, the forming-a-silicon-connection-region includes depositing a hard mask layer on the SOI substrate including the buried-type wordline, patterning the hard mask layer by using a bit line contact mask, etching the SOI substrate by using a patterned hard mask layer to thereby expose the lower silicon layer, and depositing a conductive material on the lower silicon layer.

Preferably, the conductive material includes a poly silicon including a P-type dopant which is same to a dopant included in the lower silicon layer.

Preferably, the silicon connection region including the conductive material is formed at lower level than the buried-type wordline.

Preferably, the height of the silicon connection region is determined by an etch-back process performed after the conductive material is deposited.

Preferably, the recovering-the-upper-silicon-layer includes performing a silicon epitaxial growth on the silicon connection region, and planarizing an grown silicon until the SOI substrate including the buried-type wordline is exposed.

Preferably, the method further comprises forming a source/drain region by injecting a dopant-ion at both sides of the buried type wordline.

According to another embodiment of the present invention, a semiconductor device comprises a buried-type wordline in an active region defined on a SOI substrate, a silicon connection region, located between neighboring buried type wordlines, configured to connect an upper silicon layer to a lower silicon layer which is separated from the upper silicon layer by a buried insulating layer of the SOI substrate, and a channel region configured to totally occupy a gap between the buried insulating layer and the buried-type wordline to reduce a leakage current.

Preferably, the silicon connection region transfers a back bias voltage supplied through the lower silicon layer to the upper silicon layer to thereby control a threshold voltage.

Preferably, the semiconductor device further comprises a device isolation layer configured to define the active region in the SOI substrate, and a source/drain region located at both sides of the buried-type wordline.

Preferably, the channel region transmits a charge between the source/drain region according to a voltage level supplied to the buried-type wordline.

Preferably, a depth of a bottom of the buried-type wordline is about 1000 Å to about 1300 Å and a thickness of the upper silicon layer is about 1400 Å to about 1600 Å.

Preferably, both the silicon connection region and the lower silicon layer include a substantially equivalent material.

DESCRIPTION OF SPECIFIC EMBODIMENTS

The present invention can be applied to fabricate a transistor in a cell region of the semiconductor memory device or a transistor located in a peripheral region thereof. Hereinafter, the present invention will be described in more detail with reference to the accompanying drawings.

FIGS. 1a to 1g are cross-sectional views for illustrating a method of fabricating a semiconductor device according to an embodiment of the present invention.

Figure 1A:
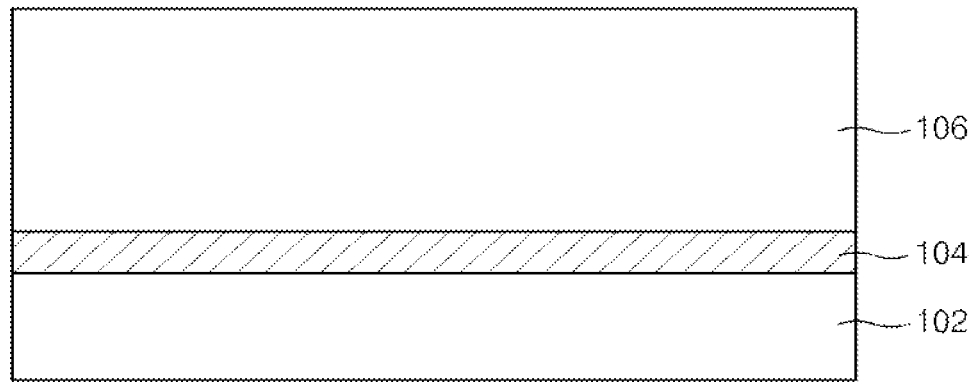
FIGS. 1a to 1h are cross-sectional views for illustrating a method of fabricating a semiconductor device according to an embodiment of the present invention.

Referring to FIG. 1a, an SOI substrate for the use in fabricating a semiconductor device includes a lower silicon layer 102, a buried insulating film 104 and an upper silicon layer 106. In detail, the lower silicon layer 102 is doped with a p-type dopant, and applied with a body voltage of about −0.8 V during the operation of the semiconductor device. In addition, the buried insulating film 104 serves to prevent the lower silicon layer 102 and the upper silicon layer 106 from being electrically connected to each other, and the upper silicon layer 106 is a region positioned over the buried insulating film 104 to form semiconductor devices, and is formed at a thickness of about 1400 to 1600 Å. Here, the buried insulating film 104 makes a barrier film unnecessary that must be formed by injecting ions into a lower portion of an active region so as to prevent a punch through phenomenon when a conventional bulk silicon substrate is used to fabricate a semiconductor device. Therefore, as compared with a conventional process for fabricating a semiconductor device, the present invention has an advantage of reducing the number of process steps.

Figure 1B:
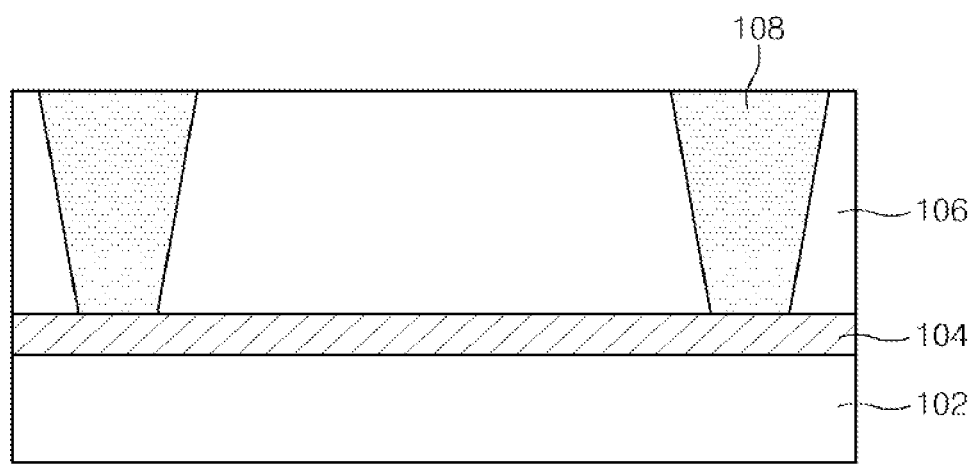

As illustrated in FIG. 1b, the upper silicon layer 106 is etched and a device isolation film 108 is formed by an STI process to define an active region. Here, the upper silicon layer 106 is etched until the buried insulating film 104 is exposed to form a trench. As described above, since the thickness of the upper silicon layer 106 of the SOI substrate is about 1600 Å or less, the process becomes much easier than a case where a trench is formed at a depth of about 3200 Å in the conventional bulk silicon substrate by the STI process. In the prior art, the trench is formed at about 3200 Å in the bulk silicon substrate and an insulating material is filled therein to form a device isolation film. Since the aspect ratio is high due to high integration, it is hard to fill in the trench without a void. However, as compared with the prior art using the bulk silicon substrate, the present invention reduces a depth of the trench into a half, so that it becomes much easier to fill the insulating material therein.

Figure 1C:
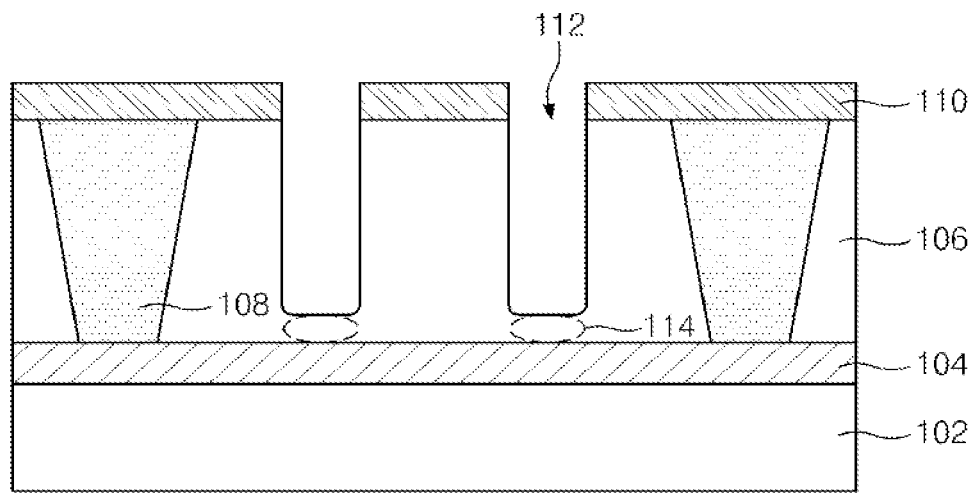

Referring to FIG. 1c, a first hard mask layer 110 is deposited on the upper silicon layer 106 and the device isolation film 108. The first hard mask layer 110 is patterned using an exposure mask defining a word line, and the upper silicon layer 106 is etched using the patterned first hard mask layer 110 as an etching mask, thereby forming a recess 112 in the active region. Here, a depth of the recess 112 ranges from about 1000 to 1300 Å, and a channel region 114 having a thickness equal to about 300 Å or less is left at a lower portion of the recess 112. Thereafter, dopant ions are implanted into the channel region 114 at the lower portion of the exposed recess 112, using the first hard mask layer 110 as an ion implanting mask. Here, the representative dopant ions may be boron (B) which is one of P-type dopants.

Since ion implantation is performed after formation of the recess 112, when the word line is not activated, a storage node contact region to be formed afterward between the recess 112 and the device isolation film 108 is surrounded by the word line formed on the device isolation film 108, the buried insulating film 104, the recess 112, and the channel region 114 formed at the lower portion of the recess 112 by the ion implantation process. Particularly, the channel region 114 completely occupies a space between the buried insulating film 104 included in the SOI substrate and the lower portion of the recess 112. Such a structure has an advantage of effectively preventing leakage of electric charges corresponding to data stored in the storage node contact region, even when the word line is not activated.

Figure 1D:
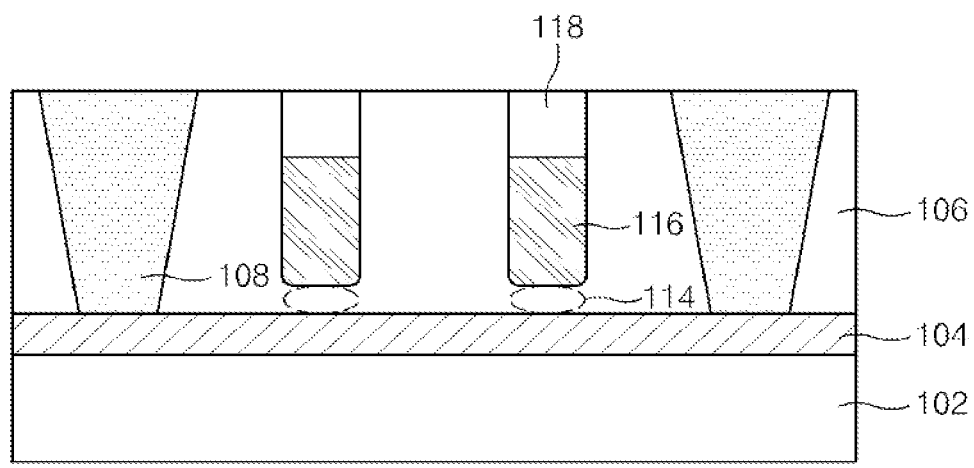

As illustrated in FIG. 1d, a conductive material is filled in the lower portion of the recess 112 to form a gate electrode 116 to be used as a word line. After the gate electrode 116 is formed, a gate hard mask film 118 is filled in an upper portion of the recess 112. Specifically, a gate oxide film (not shown) is formed on the inner sidewall and bottom of the recess 112. Next, the conductive material is filled in the lower portion of the recess 112, and an etch-back process is performed such that a certain depth of space remains in the upper portion of the recess 112. The conductive material to be used as the word-line may be W, TiN or the like. When the etch-back process is performed, the other region such as the upper silicon layer 106 other than the recess 112 or the device isolation film 108 is covered with the first hard mask layer 110 to be protected. Thereafter, the gate hard mask film 118 is filled in the upper space of the recess 112, and a Chemical Mechanical Polishing (CMP) process is performed until the upper silicon layer 106 is exposed, so that the first hard mask layer 110 is removed and the upper silicon layer 106 is planarized, to thereby complete a buried-type word line structure.

Figure 1E:
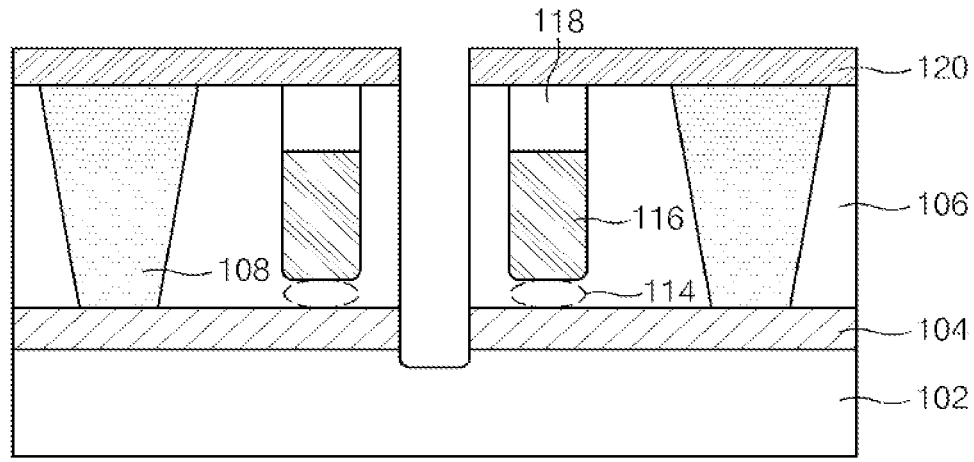

Referring to FIG. 1e, a second hard mask layer 120 is formed on the planarized upper silicon layer 106 and the device isolation film 108. The second hard mask layer 120 is patterned using an exposure mask defining a bit line contact, and the exposed upper silicon layer 106 and the buried insulating film 104 are etched using the patterned second hard mask layer 120 as an etching mask, to thereby expose the lower silicon layer 102.

Figure 1F:
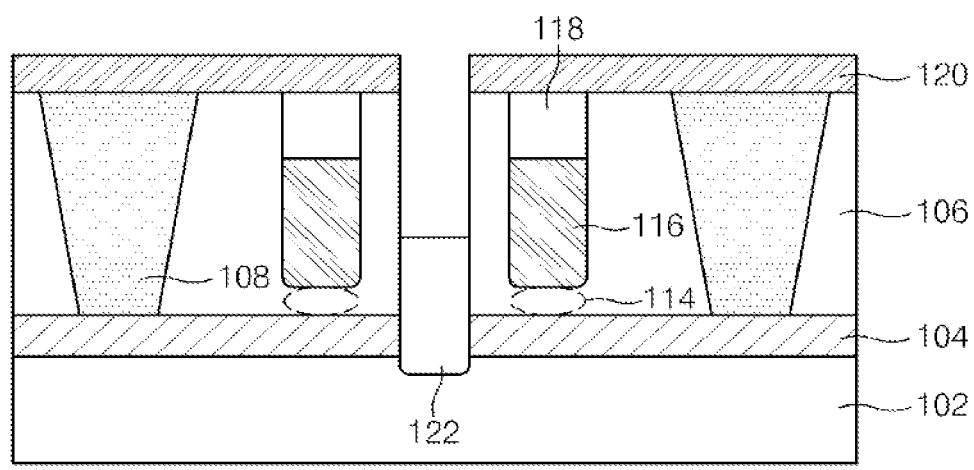

As illustrated in FIG. 1f, a connection region 122 formed of a conductive material is formed on the exposed lower silicon layer 102. Here, the connection region 122 may be formed of P-type poly silicon, which is same as a material of the lower silicon layer 102. The connection region 122 is configured to electrically connect the upper silicon layer 106 and the lower silicon layer 102, and ultimately to control a threshold voltage of the semiconductor device destabilized due to a floating body to a constant stable level, by transferring a body voltage or back bias voltage applied to the lower silicon layer 102 during the operation of the semiconductor device. The connection region 122 is thicker than the buried insulating film 104 to connect the upper and the lower silicon layers 102 and 106. Moreover, the connection region 122 is formed lower than a source/drain region to be formed between the neighboring gate electrodes 116 in a succeeding process so that they are not shorted.

In another embodiment of the present invention, an etchback process may be performed so that the top surface of the connection region 122 is not formed at the same level as that of the gate electrode 116. Therefore, the thickness of the connection region 122 may be adjusted to be lower than the sum of 300 Å which is the thickness of the channel region and the thickness of the buried insulating film 204. The region other than the connection region 122 is protected by the second hard mask layer 120 during the etch-back process.

According to the present invention, the connection region 122 is formed in a region where the bit line contact is positioned so as to stably control the threshold voltage of the semiconductor device. If the connection region 122 is formed in a region where the storage node contact is positioned, leakage current increases in a junction region formed between the storage node region, the connection region 122 and the lower silicon layer 102, and a data preservation time decreases, which is disadvantageous in terms of a refresh operation.

Figure 1G:
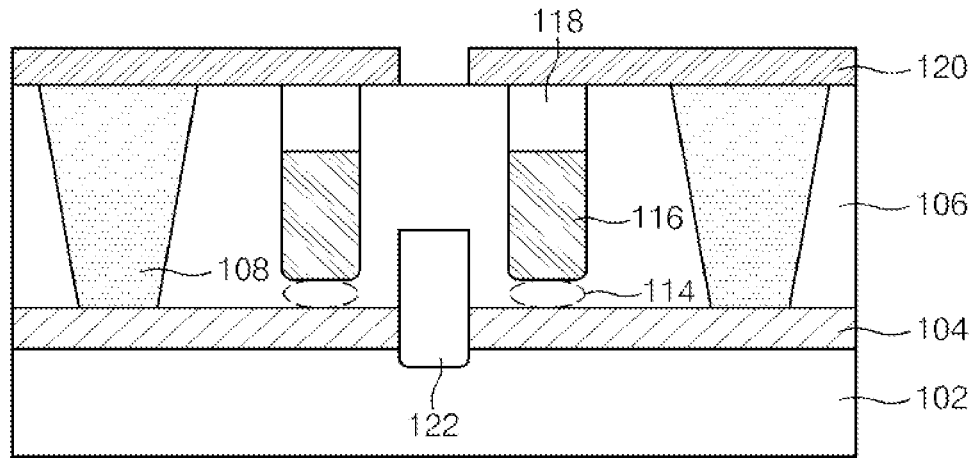
Figure 1H:
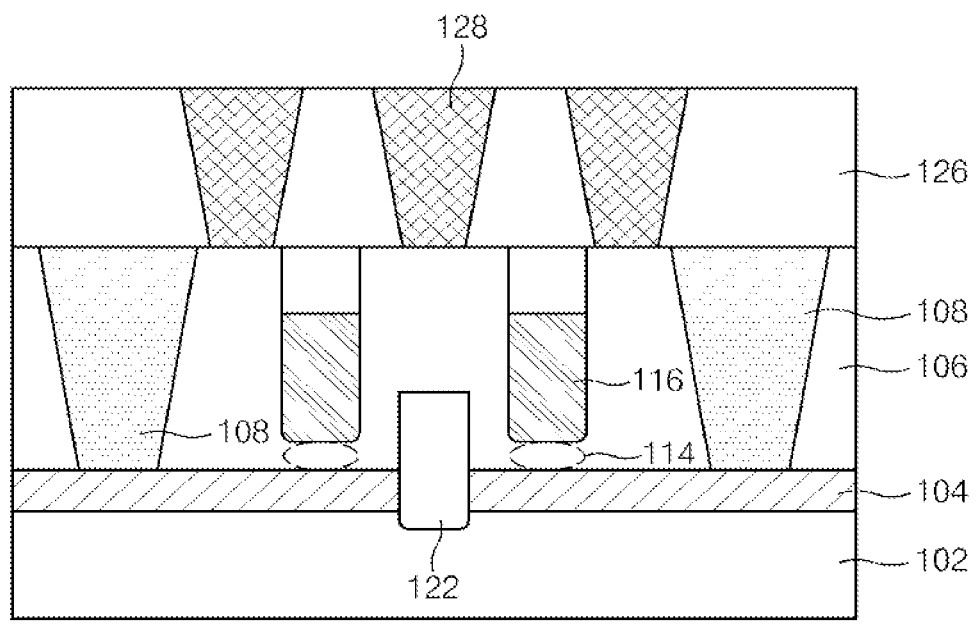

Referring to FIG. 1g, silicon is epitaxially grown on the connection region 122 to restore the etched upper silicon layer 106. After the upper silicon layer 106 is restored, the second hard mask layer 120 is removed.

Although not illustrated, dopant ions are implanted into the upper silicon layer 106 exposed to both sides of the buried-type word line to thereby form a source/drain region. Here, if the channel region is doped with a P-type dopant, the source/drain region is doped with an N-type dopant. After the source/drain region is formed, an interlayer insulating film 126 is deposited on the upper silicon layer 106 and the device isolation film 108, and a region where the bit line contact or the storage node contact are to be formed is etched, thereby exposing the source/drain region. It is possible to fabricate a cell array in the semiconductor memory device by forming a contact 128 on the source/drain region exposed by the interlayer insulating films 126, and additionally forming a bit line, a capacitor or the like on the contact.

The semiconductor device fabricated by the foregoing method includes a partial insulation substrate that includes the connection region 122 connecting the upper silicon layer 106 and the lower silicon layer 102 in the SOI substrate, the buried-type gate electrode 116 formed on the partial insulation substrate, and the channel region 114 that completely occupies the space between the buried insulating film included in the SOI substrate and the buried-type gate electrode 116 to prevent leakage current. This semiconductor device not only stably controls the threshold voltage, but also physically isolates the storage node region from the lower silicon layer 102 to reduce the leakage current, thereby considerably improving a data preservation time tREF.

As set forth herein, the method for fabricating the semiconductor device according to one embodiment of the present invention includes forming the buried-type wordline structure on the SOI substrate, forming the connection region connecting the upper silicon layer and the lower silicon layer between the neighboring buried-type wordline structures, using the bit line contact mask, and restoring silicon on the connection region.

As a result, according to the present invention, since the device isolation film can be formed by filling the insulating material in the low trench, it is possible to overcome difficulties that may occur in the process for filling the insulating material in the deep narrow trench, when the device isolation film is formed by the STI process on the conventional bulk silicon substrate. In addition, the buried insulating film of the SOI substrate removes necessity of the barrier film that must be formed by injecting ions into the lower portion of the active region so as to prevent the punch through phenomenon, when the conventional bulk silicon substrate is used to fabricate the semiconductor device. Moreover, according to the present invention, it is possible to form the connection region that electrically connects the upper silicon layer and the lower silicon layer merely by etching using the mask defining the bit line contact and deposition of the conductive material. Therefore, the semiconductor device can be fabricated without a complicated process, and an alignment error can be reduced.

As compared with the case using the conventional bulk silicon substrate, the present invention, which forms the transistor using the SOI substrate, can reduce the depth of the trench where the device isolation film defining the active region is to be formed. It is thus possible to easily prevent defects such as voids generated in the process for filling the device isolation film in the trench, and not necessary to perform a field stop implant process for improving an insulating property between cells on the bulk silicon substrate. Further, according to the present invention, the lower portion of the region where the storage node contact is to be formed is insulated, and the lower portion of the region where the bit line contact is to be formed is connected to the upper and lower silicon layers of the SOI substrate, thereby restricting the leakage current in the storage node contact region at the maximum and increasing the data preservation time. It is possible to control the threshold voltage to a certain level by applying the body voltage to the lower silicon layer.

Furthermore, according to the present invention, when the partial insulation substrate where only some region is insulated is formed, the silicon connection region connecting the upper and lower silicon layers is formed during the exposure process for forming the bit line contact. As a result, when the highly-integrated semiconductor substrate is formed, an alignment error is reduced to improve productivity.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device, comprising:
   a first buried-type wordline in an active region defined in a silicon on insulator (SOI) substrate, the SOI substrate including a lower silicon layer, an upper silicon layer, and a buried insulating layer separating the lower silicon layer from the upper silicon layer;
   a silicon connection region, located between the first buried-type wordline and a second buried-type wordline, the silicon connection region configured to connect the upper silicon layer to the lower silicon layer; and
   a dopant ion implanting region disposed in a channel region and under each buried-type wordline and configured to occupy a gap between the buried insulating layer and each buried-type wordline to isolate a storage node contact region.

2. The semiconductor device according to claim 1, further comprising:
   a device isolation layer configured to define the active region in the SOI substrate; and
   a source/drain region located at two sides of each buried-type wordline.

3. The semiconductor device according to claim 1, wherein a depth of a recess in which each buried-type wordline is disposed is about 1000 Å to about 1300 Å and a thickness of the upper silicon layer is about 1400 Å to about 1600 Å.

4. The semiconductor device according to claim 1, wherein the silicon connection region and the lower silicon layer include a substantially equivalent material.

5. The semiconductor device according to claim 1, wherein the channel region is a dopant ion implanting region.

6. The semiconductor device according to claim 5, wherein the dopant ion implanting region includes p-type dopants.

7. The semiconductor device according to claim 1, further comprising:
   an epitaxial growth layer on the silicon connection region.

8. The semiconductor device according to claim 1, wherein the storage node contact region is physically isolated from the lower silicon layer.

9. The semiconductor device according to claim 1, wherein the dopant ion implanting region is disposed above the buried insulating layer.

* * * * *